(12) United States Patent
Zhu et al.

(10) Patent No.: US 9,030,648 B2
(45) Date of Patent: May 12, 2015

(54) DUAL WAFER STAGE EXCHANGING SYSTEM FOR LITHOGRAPHIC DEVICE

(75) Inventors: Yu Zhu, Beijing (CN); Ming Zhang, Beijing (CN); Jingsong Wang, Beijing (CN); Li Tian, Beijing (CN); Dengfeng Xu, Beijing (CN); Wensheng Yin, Beijing (CN); Guanghong Duan, Beijing (CN); Jinchun Hu, Beijing (CN)

(73) Assignee: Tsinghua University, Beijing (CN)

( * ) Notice: Subject to any disclaimer, the term of this patent is extended or adjusted under 35 U.S.C. 154(b) by 866 days.

(21) Appl. No.: 13/262,802

(22) PCT Filed: Apr. 2, 2010

(86) PCT No.: PCT/CN2010/071547
§ 371 (c)(1),
(2), (4) Date: Oct. 3, 2011

(87) PCT Pub. No.: WO2010/111972
PCT Pub. Date: Oct. 7, 2010

(65) Prior Publication Data
US 2012/0127448 A1    May 24, 2012

(30) Foreign Application Priority Data
Apr. 3, 2009  (CN) .......................... 2009 1 0131506

(51) Int. Cl.
  *G03B 27/58*  (2006.01)
  *G03F 7/20*   (2006.01)
(52) U.S. Cl.
  CPC ........ *G03F 7/70733* (2013.01); *G03F 7/70716* (2013.01)
(58) Field of Classification Search
  CPC ................ G03F 7/707; G03F 7/70716; G03F 7/70733–7/70775
  USPC ................. 355/52, 53, 55, 72–77; 250/492.1, 250/492.2, 492.22, 548; 378/34
  See application file for complete search history.

(56) References Cited

U.S. PATENT DOCUMENTS

| 5,969,441 A * | 10/1999 | Loopstra et al. ........... 310/12.06 |
| 2001/0004105 A1 * | 6/2001 | Kwan et al. ................ 250/492.2 |

(Continued)

FOREIGN PATENT DOCUMENTS

| CN | 101221367 A | 7/2008 |
| CN | 101551599 A | 10/2009 |

(Continued)

OTHER PUBLICATIONS

International Search Report for PCT/CN2010/071547 filed on May 25, 2010.

*Primary Examiner* — Christina Riddle

(57) ABSTRACT

A dual wafer stage exchanging system for a lithographic device is disclosed, said system comprises two wafer stages running between an exposure workstation and a pre-processing workstation, and said two stages are set on a base and suspended above the upper surface of the base by air bearings. Each wafer stages is passed through by a Y-direction guide rail respectively, wherein one end of said guide rail is connected with a main driving unit and another end of said guide rail is detachably coupled with one of the two X-direction auxiliary driving units with single degree of freedom, and said two wafer stages are capable of moving in Y-direction along the guide rails and moving in X-direction under the drive of the auxiliary driving units with single degree of freedom. The position exchange of said two wafer stages can be enabled by the detachment and connection of the Y-direction guide rails and the auxiliary units with single degree of freedom.

4 Claims, 4 Drawing Sheets

(56) References Cited

U.S. PATENT DOCUMENTS

| | | |
|---|---|---|
| 2002/0015140 A1* | 2/2002 | Yoda ............................ 355/53 |
| 2003/0111912 A1* | 6/2003 | Binnard et al. ............... 310/12 |
| 2009/0219503 A1* | 9/2009 | Li et al. ........................ 355/74 |
| 2010/0208227 A1* | 8/2010 | Zhu et al. ..................... 355/72 |

FOREIGN PATENT DOCUMENTS

| JP | 2004342638 | 12/2004 |
|---|---|---|
| JP | 2005038874 | 2/2005 |

\* cited by examiner

DUAL WAFER STAGE EXCHANGING SYSTEM FOR LITHOGRAPHIC DEVICE

TECHNICAL FIELD

The present invention relates to a dual wafer stage exchanging system for a lithographic device, which is applied to a semiconductor lithographic device and belongs to the field of semiconductor manufacturing equipments.

BACKGROUND

In the process of manufacturing integrated circuit chips, exposure and transfer (lithography) of designed pattern for a chip on photoresist on a silicon wafer surface is one of the most important steps which is implemented by an apparatus called lithographic device (exposure device). The resolution and exposure efficiency of a lithographic device greatly influence the characteristic linewidth (resolution) and productivity of IC chips. The motion accuracy and operation efficiency of an ultraprecise wafer moving and positioning system (hereinafter referred to as wafer stage), which is a critical system of lithographic device, determine to a large extent the resolution and exposure efficiency of a lithographic device.

The fundamental principle of a step-and-scan projection lithographic device is shown in FIG. 1. Deep ultraviolet light from a light source 45 transmits through a mask 47 and a lens system 49 to image a part of pattern on the mask onto a certain chip of a wafer 50. The mask and the wafer move synchronously in opposite directions with a certain velocity ratio so as to image the entire pattern on the mask onto the certain chip on the wafer.

The basic function of a wafer moving and positioning system is to carry a wafer and move at preset speed and in preset direction during exposure to allow precise transfer of mask pattern to various areas on the wafer. Due to the small linewidth of chips (smallest linewidth of 45 nm available presently), it is required that the wafer stage has extremely high moving and positioning accuracy in order to ensure overlay accuracy and resolution of lithography. Furthermore, since the movement velocity of a wafer stage influences the productivity of lithography to a large extent, it is desired to continuously improve movement velocity of wafer stage from the view point of increasing productivity.

For traditional wafer stages such as those described in patents EP 0729073 and U.S. Pat. No. 5,996,437, only one wafer moving and positioning unit, i.e. one wafer stage, is disposed in each lithographic device. Preparations such as leveling and focusing are all implemented on the stage, which requires a long time. Particularly, alignment requires very a long time since it needs low velocity scanning (typical alignment scanning velocity is 1 mm/s) with extremely high accuracy. It is very difficult to decrease its operation time. Therefore, in order to improve productivity of lithographic devices, movement velocity of wafer stages during stepping and exposure scanning must be increased. However, increased velocity would inevitably lead to deterioration of dynamic performance of the system, and a lot of technical measures should be adopted to guarantee and enhance movement accuracy of wafer stages, which will incur much higher cost for retaining existing accuracy or achieving higher accuracy.

Patent WO 98/40791 (published on Sep. 17, 1998, Netherlands) described a structure with two wafer stages in which exposure preparation works such as wafer loading and unloading, pre-alignment and alignment are transferred to a second wafer stage that moves simultaneously with and independently from the exposure stage. While movement velocity of the wafer stage is not increased, substantial preparation works carried out on the exposure stage are now undertaken by the second wafer stage, which significantly reduces operation time of each wafer on the exposure stage, greatly improving productivity. However, the system has a major drawback of non-centroid driving for wafer stage system.

Patent of invention titled "Dual wafer stage exchanging system for Lithographic Device" filed by the applicant of the present application in 2007 (Publication No.: CN101101454) disclosed a dual wafer stage exchanging system for a lithographic device, which has advantages such as simple structure and high space utilization and thereby improving exposure efficiency of lithographic devices. However, this two-stage system still suffers some problems. First of all, air bearings need to exchange guiding surfaces upon wafer stage exchange, which imposes extremely high accuracy requirement for dimensional uniformity between wafer stages and requires micron scale or higher accuracy for components processing and assembling. Secondly, it is difficult to mount a sensor for detecting positions with respect to each other between guide rails involved in exchange, and upper linear guide rails tend to collide. The third problem is non-centroid driving of wafer stage system.

SUMMARY

In view of the shortages and defects of prior art, the object of the present invention is to provide a novel dual wafer stage exchanging system for a lithographic device to overcome shortcomings of existing wafer stage exchanging system such as non-centroid driving and extremely high accuracy requirements for processing and assembling, which has simple structure, high space utilization and avoids collision between upper linear guide rails during exchange, hence improving exposure efficiency of lithographic devices.

The first technical solution of the present invention is as follows:

A dual wafer stage exchanging system for a lithographic device, the system comprising a first wafer stage 13 operating at an exposure workstation 3 and a second wafer stage 14 operating at a pre-processing workstation 4, the two wafer stages being disposed on a same rectangular base 1 with long side in X direction and short side in Y direction, the two wafer stages being over a top surface 2 of the base, characterized in that: disposed at the two long sides of the base are the first Y linear motor stator 5 and the second Y linear motor stator 6 respectively. The first main driving unit 11, the first 1-DOF (degree-of-freedom) auxiliary driving unit 7 and the second 1-DOF auxiliary driving unit 8 share the first Y linear motor stator 5; the second main driving unit 12, the third 1-DOF auxiliary driving unit 9 and the fourth 1-DOF auxiliary driving unit 10 share the second Y linear motor stator 6; the first Y-direction guide rail 15 passes through the first wafer stage 13 and the second Y-direction guide rail 16 passes through the second wafer stage 14; the first Y-direction guide rail 15 has one end connected with the first main driving unit 11 and the other end butted with the fourth 1-DOF auxiliary driving unit 10; the fourth 1-DOF auxiliary driving unit 10 and the first Y-direction guide rail 15 are in separate structure by which they are disconnected upon position exchange of the two wafer stages; the second Y-direction guide rail 16 has one end connected with the second main driving unit 12 and the other end butted with the second 1-DOF auxiliary driving unit 8; the second 1-DOF auxiliary driving unit 8 and the first Y-direction guide rail 16 are in separate structure by which they are disconnected upon position exchange of the two wafer stages;

when the two wafer stages exchange their positions, first of all, the first wafer stage 13 moves toward the first main driving unit 11 along the first Y-direction guide rail 15, and the second wafer stage 14 moves toward the second main driving unit 12 along the second Y-direction guide rail 16; then, the first Y-direction guide rail 15 separates from the fourth 1-DOF auxiliary driving unit 10 and moves toward the first main driving unit 11, and the second Y-direction guide rail 16 separates from the second 1-DOF auxiliary driving unit 8 and moves toward the second main driving unit 12, at the same time the second 1-DOF auxiliary driving unit 8 and the fourth 1-DOF auxiliary driving unit 10 move to left and right edges of the base, respectively; then, the first main driving unit 11 and the second main driving unit 12 drive the first wafer stage 13 and the second wafer stage 14 respectively to experience station exchange in X direction, at the same time, the first 1-DOF auxiliary driving unit 7 moves to an initial position of the exposure workstation 3, and the third 1-DOF auxiliary driving unit 9 moves to an initial position of the pre-processing workstation 4; finally, the first Y-direction guide rail 15 and the third 1-DOF auxiliary driving unit 9 are butted together, and the first wafer stage 13 moves to an initial position of the pre-processing workstation 4, the second Y-direction guide rail 16 and the first 1-DOF auxiliary driving unit 7 are butted, and the second wafer stage 14 moves to an initial position of the exposure workstation 3, the exchange is completed and the system enters a next cycle.

The said dual wafer stage exchanging system for a lithographic device, characterized in that: said first 1-DOF auxiliary driving unit 7, the second 1-DOF auxiliary driving unit 8, the third 1-DOF auxiliary driving unit 9 and the fourth 1-DOF auxiliary driving unit 10 are all provided with linear motor rotors 17 on their bottom, each 1-DOF auxiliary driving unit is provided with a vacuum preloaded air bearing 19 on its side that contacts the base, each 1-DOF auxiliary driving unit is provided with a permanent magnetism preloaded air bearing 20 on its bottom surface that contacts the base; said first main driving unit 11 and said second main driving unit 12 are 2-DOF driving units, each of which are mounted at the bottom thereof with a linear motor rotor 17 same as that of the 1-DOF auxiliary driving unit, each main driving unit is provided with a vacuum preloaded air bearing 19 on its side that contacts the base, each main driving unit is provided with a permanent magnetism preloaded air bearing 20 on its bottom surface that contacts the base, and further, between a top of each main driving unit and the Y-direction guide rail, a roller ball guide rail or an air bearing is mounted for guiding, and a linear motor or a friction wheel plus stepper motor is mounted for driving, so as to enable the main driving unit to drive and support the Y-direction guide rail.

The said dual wafer stage exchanging system for a lithographic device, characterized further in that: a linear grating for position feedback is mounted on the linear motor of each said driving unit respectively. The system further comprises a dual frequency laser interferometer for position feedback of wafer stage movement.

Compared with prior art, the present invention has the following significant advantages: First of all, the wafer stages of the system are centroid-driven. Secondly, the exchange surface does not use air bearing, which has low requirement for dimensional uniformity. Thirdly, both auxiliary driving units are of single degree of freedom, which simplifies the control system structure and relaxes accuracy requirement for mounting system components.

Figure 1:
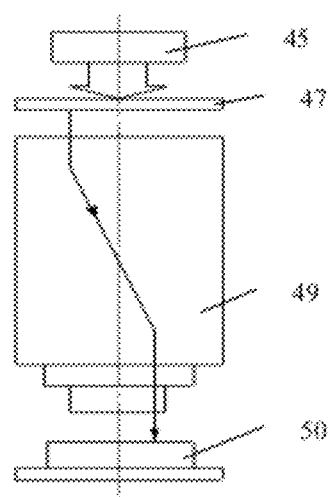
FIG. 1 is a schematic diagram illustrating operating principle of a lithographic device.

Reference numerals in the drawings: 1—base; 2—top surface of base; 3—exposure workstation; 4—pre-processing workstation; 5—first Y linear motor stator; 6—second Y linear motor stator; 7—first 1-DOF auxiliary driving unit; 8—second 1-DOF auxiliary driving unit; 9—third 1-DOF auxiliary driving unit; 10—fourth 1-DOF auxiliary driving unit; 11—first main driving unit; 12—second main driving unit; 13—first wafer stage; 14—second wafer stage; 15—first Y-direction guide rail; 16—second Y-direction guide rail; 17—linear motor rotor of 1-DOF auxiliary driving unit; 18—linear motor rotor of main driving unit; 19—vacuum preloaded air bearing; 20—permanent magnetism preloaded air bearing; 21—linear motor stator magnetic steel of Y-direction guide rail; 22—air bearing on bottom surface of stage; 23—air bearing for main driving unit and Y-direction guide rail; 24—closed preloaded air bearing; 25a—side of Y-direction guide rail for butting; 25b—side of 1-DOF auxiliary driving unit for butting; 45—light source; 47—mask; 49—lens system; 50—wafer.

DETAIL DESCRIPTION

Figure 2:
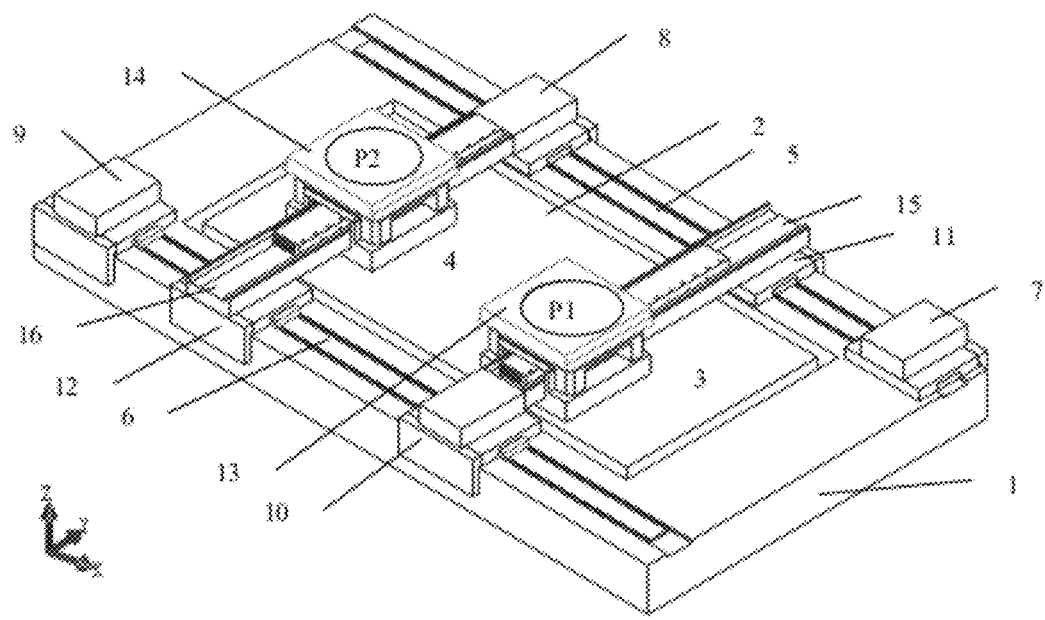
FIG. 2 shows a dual wafer stage exchanging system for lithographic device according to the present invention in a state before exchange.

FIG. 2 shows a structural representation of the dual wafer stage exchanging system for a lithographic device. The system includes a rectangular base 1 with long sides in X direction and short sides in Y direction, a first wafer stage 13 operating at an exposure workstation 3 and a second wafer stage 14 operating at a pre-processing workstation 4. These two stages are mounted on the base in such manner that they suspend over a top surface 2 of the base via an air bearing 22 on bottom surface of the stage. Disposed at the two long sides of the base are the first Y linear motor stator 5 and the second Y linear motor stator 6 respectively. The first main driving unit 11, the first 1-DOF auxiliary driving unit 7 and the second 1-DOF auxiliary driving unit 8 share the first Y linear motor stator 5. The second main driving unit 12, the third 1-DOF auxiliary driving unit 9 and the fourth 1-DOF auxiliary driving unit 10 share the second Y linear motor stator 6. The first Y-direction guide rail 15 passes through the first wafer stage 13 with its one end connected with the first main driving unit 11. The first wafer stage 13 is movable along the first Y-direction guide rail 15 and the other end thereof is connected with the fourth 1-DOF auxiliary driving unit 10. The first main driving unit 11 and the fourth 1-DOF auxiliary driving unit 10 cooperate to drive the wafer stage to move in X direction. Similarly, the second Y-direction guide rail 16 passes through the second wafer stage 14 with its one end connected with the second main driving unit 12 so that the second wafer stage 14 can move in Y direction along the guide 16. The other end of the stage is connected with the second 1-DOF auxiliary driving unit 8. The second main driving unit 12 and the second 1-DOF auxiliary driving unit 8 cooperate to drive the wafer stage to move in X direction.

Figure 3:
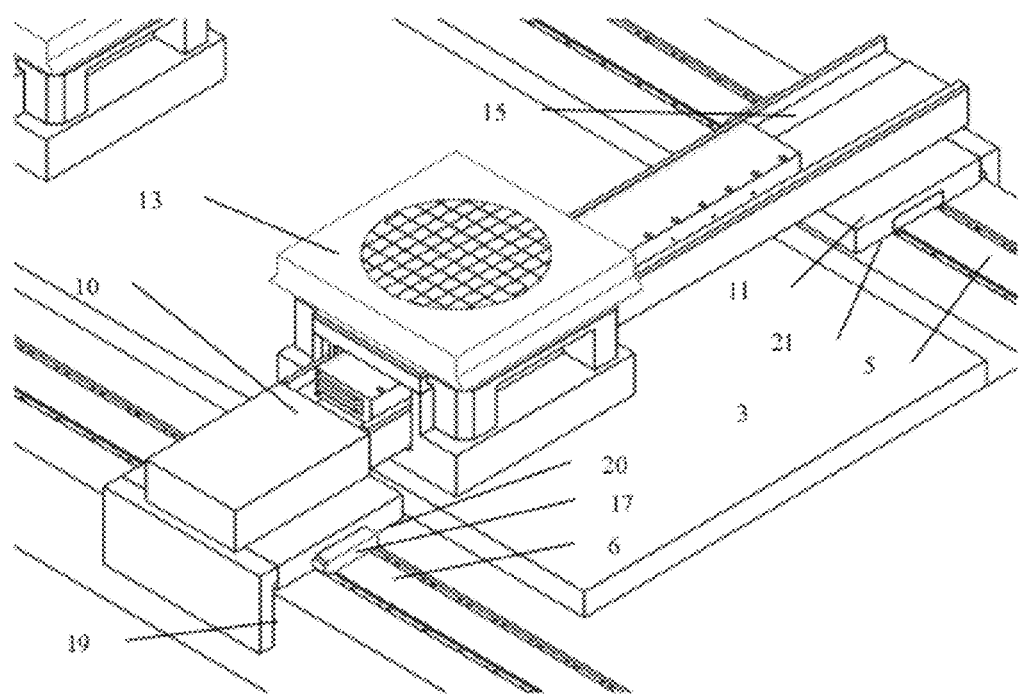
FIG. 3 shows a structure of driving units on either side of the wafer stage.
Figure 4:
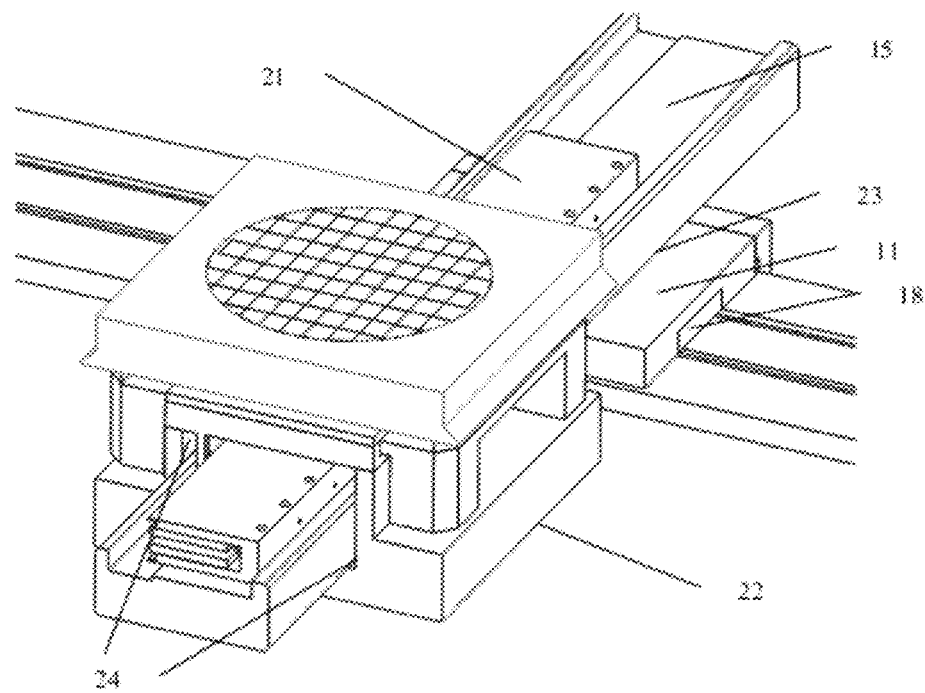
FIG. 4 shows structures of the wafer stage and the Y-guide.

FIGS. 3 and 4 show structures and connection of the 1-DOF auxiliary driving unit, the wafer stage, the Y-direction guide rail and the main driving unit and arrangement of the air bearing. On each bottom of the 1-DOF auxiliary driving units is mounted a linear motor rotor and a vacuum preloaded air bearing and the stator is mounted on the base. When the 1-DOF auxiliary driving unit is butted with the first Y-direction guide rail 15, it cooperates with the main driving unit to drive the wafer stage to move in X direction. Connection between the Y-direction guide rails and the main driving units may be implemented by a roller ball guide rail or an air bearing for guiding and by a linear motor or a friction wheel plus motor for driving. The other end of the Y-direction guide rail is connected with a 1-DOF auxiliary driving unit for precise abutting joint via electromagnetism or vacuum suction.

FIG. 4 shows a connection structure of the wafer stage and the Y-guide. Mounted on the bottom of the first wafer stage 13 is a vacuum preloaded air bearing. The top surface of the base is a guiding surface. The first Y-direction guide rail 15 passes through the first wafer stage 13. Mounted on the first Y-direction guide rail 15 is a linear motor stator magnetic steel 21 of the Y-direction guide rail. A coil is mounted on the wafer stage as a rotor of the linear motor. Mounted on the two internal vertical sides of the first wafer stage 13 are closed preloaded air bearings 24 to restrain relative movement in Y direction of the Y-direction guide rail 15 and the first wafer stage 13.

Figure 5:
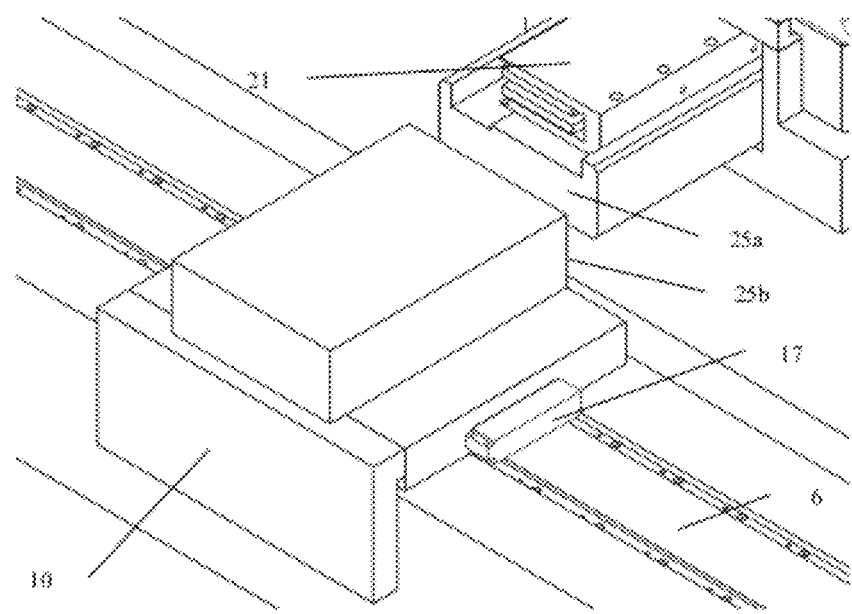
FIG. 5 shows connection among the wafer stage, the Y-guide, a main driving unit and a single-degree-of-freedom (1-DOF) auxiliary driving unit.

FIG. 5 shows a connection between the Y-direction guide rail and the 1-DOF auxiliary driving unit. The 1-DOF auxiliary driving unit 10 and the first Y-direction guide rail 15 are butted in such manner that precise abutting joint on the connecting surfaces and detachment may be realized through electromagnetism or vacuum suction, hence allowing position exchange of wafer stages.

Figure 6:
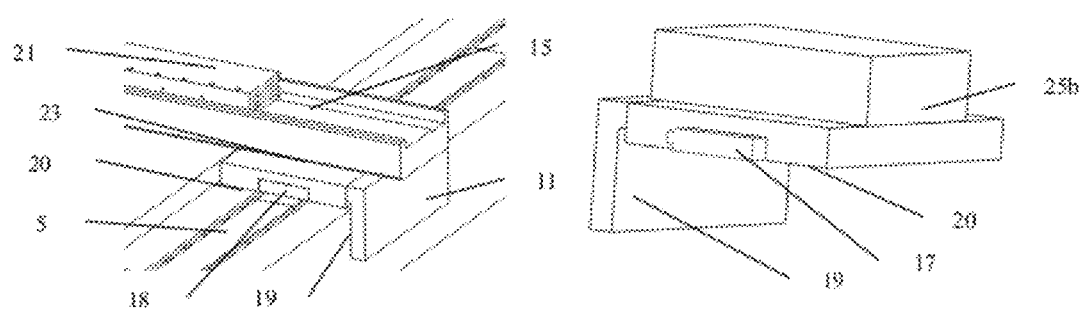
FIG. 6 shows a structure of the 1-DOF auxiliary driving unit.

FIG. 6 shows structures of the main driving unit and the 1-DOF auxiliary driving unit. As previously stated, the main driving unit is a 2-DOF driving unit that mainly drives the stage to move in X direction, and also drives the Y-direction guide rail to move in Y direction. Therefore the main driving unit has a structure in which a linear motor rotor coil 18 is mounted at the bottom portion thereof, a vacuum preloaded air bearing 19 is mounted on a side surface and a permanent magnetism preload air bearing 20 is mounted on the bottom surface. Connection with the Y-direction guide rail may be implemented by a roller ball guide rail or an air bearing for guiding and by a linear motor or a friction wheel plus stepper motor for driving.

The 1-DOF auxiliary driving unit cooperates with the main driving unit to drive the wafer stage to move in X direction, therefore it has a structure in which a linear motor coil rotor is mounted at the bottom portion thereof, a vacuum preloaded air bearing 19 is mounted on a side surface and a permanent magnetism preloaded air bearing 20 is mounted on the bottom surface.

Figure 7:
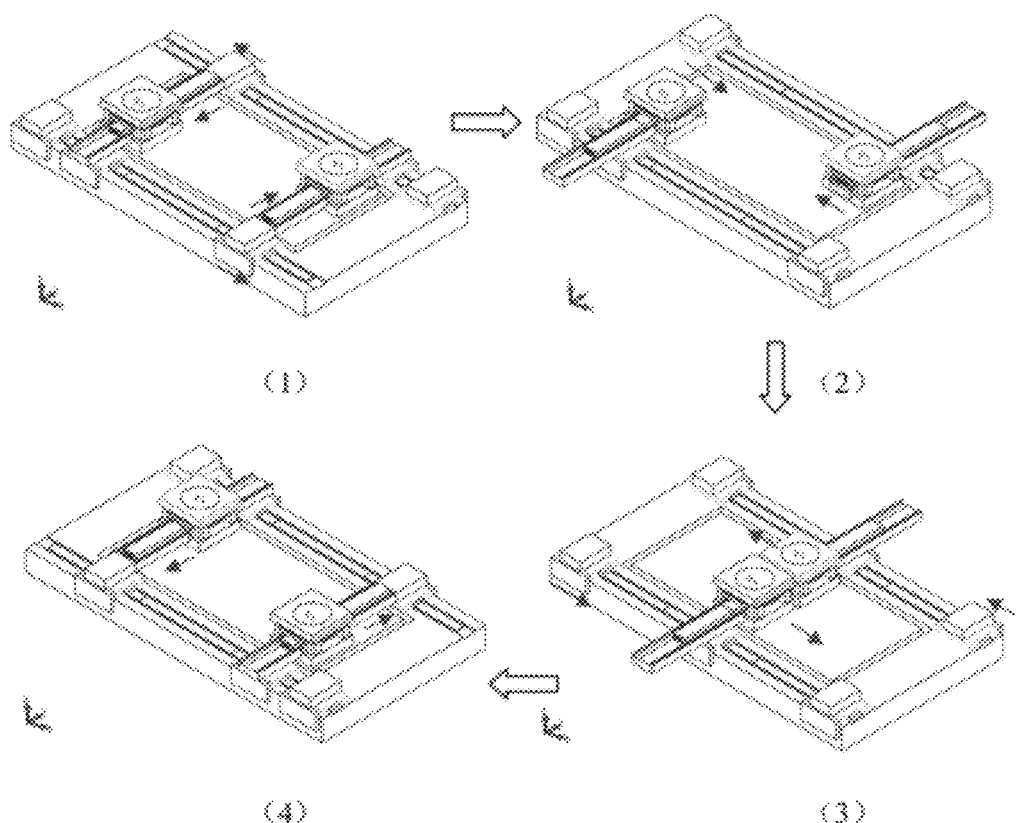
FIG. 7 shows the process in which the two wafer stages are exchanged.

FIG. 7 shows the process in which the two wafer stages are exchanged. At the original positions of the first wafer stage 13 and the second wafer stage 14 before exchange, the third 1-DOF auxiliary driving unit 9 is butted with the first Y-direction guide rail 15, and cooperates with the first main driving unit 11 to drive the first wafer stage 13 to experience exposure movement at the exposure workstation 3. The second 1-DOF auxiliary driving unit 8 and the second Y-direction guide rail 16 are butted, and cooperates with the second main driving unit 12 to drive the second wafer stage 14 to experience pretreatment movement at the pre-processing workstation 6.

After the wafer stages complete their pretreatment and exposure procedures individually, the system enters the two-stage exchange state. The first wafer stage 13 moves toward the first main driving unit 11 along the first Y-direction guide rail 15 to one side of the base, and the second wafer stage 14 moves toward the second main driving unit 12 along the second Y-direction guide rail 16 to the other side of the base, as shown in FIG. 7(1).

After that, the first wafer stage 13 and the first Y-direction guide rail 15 disengage from the fourth 1-DOF auxiliary driving unit 10, and the first Y-direction guide rail 15 moves toward the first main driving unit 11. In the meanwhile, after disengagement, the fourth 1-DOF auxiliary driving unit 10 moves toward the nearest corner of the base until it reaches an edge. On the other side, the second wafer stage 14 and the second Y-direction guide rail 16 disengage from the second 1-DOF auxiliary driving unit 8, and the second Y-direction guide rail 16 moves toward the second main driving unit 12. In the meanwhile, after disengagement, the second 1-DOF auxiliary driving unit 8 moves toward the nearest corner of the base until it reaches an edge, as shown in FIG. 7(2).

After the first wafer stage 13 moves to an edge of the base, the first main driving unit 11 drives the first wafer stage 13 to move toward the pre-processing workstation 4 in X direction, so as to arrive at the pretreatment initial positions of wafer. The first 1-DOF auxiliary driving unit 7 and the first wafer stage 13 on the same side move in identical direction and stop at the exposure initial position of wafer. The second wafer stage 14 on the other side experiences the same movement, and the second main driving unit 12 drives the second wafer stage 14 to move toward the exposure workstation 3 in X direction until it arrives at the exposure initial position of wafer. The third 1-DOF auxiliary driving unit 9 and the second wafer stage 14 on the same side move in identical direction and stop at the pretreatment initial position of wafer, as shown in FIG. 7(3).

After the two wafer stages arrive at initial positions of their specified station, the first Y-direction guide rail 15 protrudes toward the third 1-DOF auxiliary driving unit 9 for abutting joint, and the first wafer stage 13 moves along the first Y-direction guide rail 15 to the initial position of pre-processing workstation. In the meanwhile, the second Y-direction guide rail 16 protrudes along the first 1-DOF auxiliary driving unit 7 for abutting joint, and then the second wafer stage 14 moves along the second Y-direction guide rail 16 to the initial position of exposure workstation, as shown in FIG. 7(4). So far, the position exchange of the two wafer stages is completed and the system enters the next cycle.

The invention claimed is:

1. A dual wafer stage exchanging system for a lithographic device, the system comprising a first wafer stage (13) operating at an exposure workstation (3) and a second wafer stage (14) operating at a pre-processing workstation (4), the two wafer stages being disposed on a same rectangular base (1) with a long side in X direction and a short side in Y direction, the two wafer stages being over a top surface (2) of the base, wherein:

disposed at the two long sides of the base are a first Y linear motor stator (5) and a second Y linear motor stator (6) respectively, a first main driving unit (11), a first 1-DOF auxiliary driving unit (7), and a second 1-DOF auxiliary driving unit (8) share the first Y linear motor stator (5), a second main driving unit (12), a third 1-DOF auxiliary driving unit (9), and a fourth 1-DOF auxiliary driving unit (10) share the second Y linear motor stator (6); a first Y-direction guide rail (15) passes through the first wafer stage (13), and a second Y-direction guide rail (16)

passes through the second wafer stage (14); the first Y-direction guide rail (15) has one end connected with the first main driving unit (11) and the other end butted with the fourth 1-DOF auxiliary driving unit (10); the fourth 1-DOF auxiliary driving unit (10) and the first Y-direction guide rail (15) are in a separate structure by which they are disconnected upon position exchange of the two wafer stages; the second Y-direction guide rail (16) has one end connected with the second main driving unit (12) and the other end butted with the second 1-DOF auxiliary driving unit (8); the second 1-DOF auxiliary driving unit (8) and the first Y-direction guide rail (16) are in a separate structure by which they are disconnected upon position exchange of the two wafer stages; when the two water stages exchange their positions, first of all, the first wafer stage (13) moves toward the first main driving unit (11) along the first Y-direction guide rail (15), and the second water stage (14) moves toward the second main driving unit (12) along the second Y-direction guide rail (16); then, the first Y-direction guide rail (15) separates from the fourth 1-DOF auxiliary driving unit (10) and moves toward the first main driving unit (11), and the second Y-direction guide rail (16) separates from the second 1-DOF auxiliary driving unit (8) and moves toward the second main driving unit (12), at the same time the second 1-DOF auxiliary driving unit (8) and the fourth 1-DOF auxiliary driving unit (10) move to left and right edges of the base, respectively; then, the first main driving unit (11) and the second main driving unit (12) drive the first wafer stage (13) and the second wafer stage (14) respectively to experience station exchange in X direction, at the same time, the first 1-DOF auxiliary driving unit (7) moves to an initial position of the exposure workstation (3), and the third 1-DOF auxiliary, driving unit (9) moves to an initial position of the pre-processing workstation (4); finally, the first Y-direction guide rail (15) and the third 1-DOF auxiliary driving unit (9) are butted together, and the first wafer stage (13) moves to an initial position of the pre-processing workstation (4), the second Y-direction guide rail (16) and the first 1-DOF auxiliary driving unit (7) are butted, and the second wafer stage (14) moves to an initial position of the exposure workstation (3), the exchange is completed and the system enters a next cycle.

2. The dual wafer stage exchanging system for a lithographic device according to claim 1, wherein the first 1-DOF auxiliary, driving unit (7), the second 1-DOF auxiliary driving unit (8), the third 1-DOF auxiliary driving unit (9) and the fourth 1-DOF auxiliary driving unit (10) are each provided with linear motor rotors (17) on its bottom, each 1-DOF auxiliary driving unit is provided with a vacuum preloaded air bearing (19) on its side surface that contacts the base, each 1-DOF auxiliary driving unit is provided with a permanent magnetism preloaded air bearing (20) on its bottom surface that contacts the base; said first main driving unit (11) and said second main driving unit (12) are 2-DOF driving units, on the bottom of each of which are mounted a linear motor rotor (17) that is substantially the same as the 1-DOF auxiliary driving unit, each main driving unit is provided with a vacuum preloaded air bearing (19) on its side surface that contacts the base, each main driving unit is provided with a permanent magnetism preloaded air bearing (20) on its bottom surface that contacts the base, and between a top of each main driving unit and the Y-direction guide rail, a roller ball guide rail or an air bearing is mounted for guiding and a linear motor or a friction wheel plus a stepper motor is mounted for driving, so as to enable the main driving unit to drive and support the Y-direction guide rail.

3. The dual wafer stage exchanging system for a lithographic device according to claim 2, wherein a linear grating for position feedback is mounted on the linear motor of each said driving unit respectively.

4. The dual wafer stage exchanging system for a lithographic device according to claim 1, wherein the dual wafer stage exchanging system for the lithographic device further comprises a dual frequency laser interferometer for position feedback of wafer stage movement.

* * * * *